United States Patent [19]
De Kort et al.

[11] Patent Number: 5,459,394
[45] Date of Patent: Oct. 17, 1995

[54] ELECTRO-OPTIC MEASUREMENT DEVICE FOR THE MEASUREMENT OF AN ELECTRIC SIGNAL IN AN ELECTRONIC COMPONENT

[75] Inventors: Cornelis G. C. M. De Kort; Joris J. Vrehen; Gert W. 't Hooft, all of Eindhoven, Netherlands

[73] Assignee: U.S. Philips Corporation, New York, N.Y.

[21] Appl. No.: 113,535

[22] Filed: Aug. 27, 1993

Related U.S. Application Data

[63] Continuation-in-part of Ser. No. 926,068, Aug. 5, 1992, abandoned.

[30] Foreign Application Priority Data

Aug. 5, 1991 [EP] European Pat. Off. .............. 91202003

[51] Int. Cl.⁶ .................................................... G01R 31/00
[52] U.S. Cl. .................................................. 324/96; 324/750
[58] Field of Search .......................... 324/96, 765, 117 R, 324/244.1, 753, 750; 250/310, 311; 356/400; 359/248, 218

[56] References Cited

U.S. PATENT DOCUMENTS

| | | | |
|---|---|---|---|
| 4,220,854 | 9/1980 | Feuerbaum et al. | 250/310 |
| 4,539,477 | 9/1985 | Feuerbaum et al. | 250/310 |
| 4,857,836 | 8/1989 | Soelkner | 324/96 |
| 4,866,372 | 9/1989 | Aoshima et al. | 324/96 |
| 4,996,475 | 2/1991 | Takahashi et al. | 324/96 |
| 5,006,789 | 4/1991 | Williamson | 324/96 |
| 5,034,683 | 7/1991 | Takahashi et al. | 324/96 |
| 5,041,783 | 8/1991 | Ohta et al. | 324/96 |
| 5,055,770 | 10/1991 | Takahashi et al. | 324/96 |

FOREIGN PATENT DOCUMENTS

| | | |
|---|---|---|
| 0293841 | 12/1988 | European Pat. Off. . |
| 0294593 | 12/1988 | European Pat. Off. . |
| 0306359 | 3/1989 | European Pat. Off. . |
| 2017939 | 10/1979 | United Kingdom . |

OTHER PUBLICATIONS

Microelectronic Engineering vol. 16 No. 1/4 (Mar. 1992) pp. 341–348 "Waveform Measurements with Calibrated Amplitude by Electro–Optic Samples in IC's" by Kees De Kort and Joris J. Brehen.

Primary Examiner—Vinh P. Nguyen
Attorney, Agent, or Firm—Bernard Franzblau

[57] ABSTRACT

An electro-optical measurement device for the sampling of an electric signal (SI) in an electronic component by means of a radiation beam. Special embodiments of the electro-optic measurement device are described. An electro-optic sensor element is provided with an electrically conductive tip at one side and with an electrode at the other side, so that an absolute and calibrated measurement is possible. The measurement beam can be high-frequency pulsed with a pulse (Lp) per period of the test signal (SI). The pulse series is low-frequency modulated and the pulses exhibit, relative to the test signal, a constant phase relationship during the first half periods of the modulation signal and a varying phase relationship during the second half periods so that accurate and reliable measurement is possible.

21 Claims, 6 Drawing Sheets

ELECTRO-OPTIC MEASUREMENT DEVICE FOR THE MEASUREMENT OF AN ELECTRIC SIGNAL IN AN ELECTRONIC COMPONENT

This is a continuation-in-part of application Ser. No. 07/926,068, filed Aug. 5, 1992, abandoned.

BACKGROUND OF THE INVENTION

This invention relates to an electro-optic measurement device for optically measuring an electric signal in an electronic component, which device comprises a radiation source for supplying an optical radiation beam, a sensor comprising an electro-optic crystal, an optical system which is arranged between the radiation source and the crystal in order to focus the radiation beam in a radiation spot on a first side of the crystal which faces the component to be measured, and a detection system for converting a change of phase in the radiation beam, generated by the electro-optic crystal due to birefringence induced in the crystal into an electric signal, the crystal being mounted on a transparent carrier means.

The described electro-optic measurement device is known from the publication "Non-contact picosecond electro-optic sampling utilizing semiconductor laser pulses" by S. Aoshima et at., SPIE, Vol. 1155 Ultrahigh Speed and High Speed Photography, Photonics and Videography '89, pages 499–510. The measurement device described therein comprises a sensor in the form of an electro-optic crystal which is positioned in the vicinity of an electric signal to be measured and originating from an electronic component. The electro-optic crystal is mounted on a transparent substrate by way of a base surface. The electric field generated by the signal changes the birefringence of the crystal. As a result, a light-beam, for example, originating from a laser and applied to the crystal will incur a change of phase. The birefringence and hence the electric signal responsible for the birefringence can be measured by detection of said change of phase.

The sensitivity of this device is highly dependent on the distance between the electro-optic crystal and the component to be measured. This distance should be as small as possible in order to ensure that the electric field generated by the signal at the point of the component to be measured is as large as possible at the area of the crystal. However, the component to be measured exhibits irregularities so that said distance cannot be arbitrarily small. In the cited publication in "SPIE Vol. 1155 Ultrahigh Speed and High Speed Photography Photonics and Videography, 1989, pp. 499–504, it is proposed to increase the electric field in the crystal by introducing a medium, preferably a liquid medium having a comparatively high dielectric constant, between the crystal and the component to be measured. However, the cited publication already notes that the effect of this medium is inadequate in the case of high signal frequencies. Moreover, in the known device the electric fields originating from signals at points in the vicinity of the component point to be measured may extend as far as the electro-optic crystal, notably if the geometrical distance or the effective distance reduced by the dielectric medium is too small, so that these stray fields influence the birefringence of the crystal and cross-talk is liable to occur. This cross-talk effect occurs especially during measurements performed on integrated circuits comprising a large number of components per unit of surface area.

SUMMARY OF THE INVENTION

The present invention provides an electro-optic measurement device in which the distance between the electro-optic crystal and the component to be measured need not be small and which exhibits hardly any cross-talk effects. To achieve this, the device in accordance with the invention is characterized in that an electrically conductive, tip-shaped element is provided on the first side of the electro-optic crystal. An essential advantage of the tip-shaped element consists in that, when brought into contact with the track or the conductor whose signal is to be measured, the voltage present thereon is transferred substantially without attenuation to the lower side of the crystal. Because only the voltage on the relevant track is transferred, moreover, the birefringence of the crystal is determined substantially exclusively by the signal on this track. As a result, the risk of cross-talk between signals on neighbouring tracks is greatly reduced. Because the voltage on the lower side of the crystal is equal to that at the measurement point, a calibrated measurement can be performed by means of a special embodiment yet to be described.

For the tip-shaped element various electrically conductive materials may be chosen, for example doped silicon, tungsten or a metal. A metal tip offers the advantage that it also acts as a reflector of small dimensions, so that the radiation intercepted by the detection system will originate from a small radiation spot on the first side of the crystal. As a result, in given circumstances the already high resolution of the novel measurement device can be further enhanced or the requirements imposed on the optical system may be less severe.

The tip-shaped element may terminate in an electrically conducting wire. This has the advantage that the distance between the electro-optic crystal and the point to be measured on the component is increased, thus even further reducing the risk of crosstalk effects.

The electro-optic measurement device preferably is also characterized in that a portion of the carrier means which faces the crystal is provided with an electrode for applying a reference voltage to the crystal. Via this electrode, a special embodiment of which is disclosed in the cited article in SPIE Vol. 1155 Ultrahigh Speed and High Speed Photography Photonics and Videography, 1989, an absolute voltage measurement can be performed. Because the electrode is combined with the electrically conductive, tip-shaped element in the device in accordance with the invention, a calibrated measurement can be performed.

The electrode may be arranged between the carrier means and the electro-optic crystal so that the voltage across the upper side of the crystal equals the reference voltage. In that case the electrode should be transparent. However, the electrode may alternatively be mounted on the circumference of the carrier means and may also extend across a portion of the electro-optic crystal. The voltage across the upper side of the crystal is then also defined rather well by the reference voltage.

A further embodiment of the electro-optic measurement device in accordance with the invention is characterized in that the reference voltage is formed by the output voltage of an electronic processing circuit, an input of which is connected to the output of the detection system.

Thus, automatic feedback is achieved and a zero point measurement can be performed. The voltage across the electrode then equals the measurement signal at any instant. Such a zero point measurement offers, inter alia the advantage that the risk of measurement errors is reduced.

Preferably, the radiation beam is focused by an objective system so as to form a radiation spot of minimum dimensions on the lower side of the electro-optic crystal, the beam passing through the transparent carrier then being a converging beam. If the upper side of this carrier is flat, like in the known devices, additional radiation refraction occurs on this upper side so that said radiation spot is enlarged and radiation will be incident outside the metal point, and hence will be lost to the measurement. In order to prevent this, the device in accordance with the invention may be further characterized in that the carrier means comprises an element of a radiation-transparent material which is shaped as a sector of a sphere, the centre of curvature of which is coincident with the point of intersection of the main my of the radiation beam and the second side of the crystal. The use of an element shaped as a sector of sphere prevents imaging artifacts, so that the size of the radiation spot is determined exclusively by the optical quality of said optical system.

A further embodiment of the measurement device in accordance with the invention, in which the optical system comprises an objective system, is characterized in that the carrier means is secured to the objective system. This results in a compact measurement device.

An alternative embodiment of the measurement device in accordance with the invention is characterized in that the carrier means comprises a radiation-conductive fibre having an entrance face which faces the radiation source and an exit face which is connected to the electro-optic crystal.

The fibre conducts the measurement radiation and protects it against ambient influences. When the polarization change of the measurement beam due to the birefringence is measured, the fibre is preferably a polarization-sustaining fibre.

A further embodiment of the measurement device in accordance with the invention is characterized in that the radiation-conductive element is secured to an xyz manipulator. The crystal can thus be accurately aligned relative to the track to be measured on the component.

A further embodiment of the measurement device in accordance with the invention is characterized in that a partly transparent element is arranged in the path between the radiation source and the sensor in order to split a beam supplied by the radiation source into a measurement beam which is directed towards the electro-optic crystal and a reference beam which is directed towards a reference reflector, and to combine the reference beam and the measurement beam after reflection. The phase shift produced in the measurement beam is thus measured by interferometry.

A further embodiment of the measurement device in accordance with the invention is characterized in that a radiation-conductive fibre is arranged in at least one of the beam paths between the partly transparent element and the electro-optic crystal and the reference reflector, respectively.

As a result, the beams will hardly be influenced by the surroundings. If, moreover, the length of the reference fibre and the length of the fibre through which the measurement beam propagates are equal, any effects of the fibres on the radiation beams are also eliminated. When pulsed radiation beams are used, the lengths of the fibres should be equal to within a few millimetres, so that the measurement pulses and the reference pulses reach the detection system simultaneously or substantially simultaneously. The use of fibres results in a high degree of freedom in designing the measurement device.

The electro-optic effect utilized in the measurement device is only a small effect, so that small variations of a signal having a comparatively high signal level must be measured. Therefore, in this device the measurement signal is preferably modulated with a fixed frequency which is sufficiently remote from that of the test signal. A modulation method which is attractive because of its simplicity is performed in an embodiment of the device in accordance with the invention which is characterized in that a rotatable $\lambda/2$ plate is arranged in the path of the beam travelling to the electro-optic crystal, $\lambda$ being the wavelength of the radiation beam.

The polarization direction of the beam entering the crystal is rotated by rotation of the plate so that a dynamic measurement signal is obtained. The $\lambda/2$ plate rotates the polarization direction at twice the angular frequency and, if this plate is arranged in the path of the forward measurement beam as well as that of the reflected measurement beam, rotation takes place at four times the angular frequency, so that the modulation frequency amounts to four times the rotation frequency of the $\lambda/2$ plate. As a result, the method is less susceptible to disturbances or interference at frequencies equal to the angular speed or twice the angular speed.

By using a pulsed laser beam where the pulse duration of the laser pulses is a few orders of magnitude shorter than the period of the periodic test signal applied to the electronic component and by slightly shifting the instants at which successive laser pulses are generated each time relative to the period of the test signal, the variation in time of the signal, in other words the waveform, at the relevant position on the component can be determined. This method is known as the sampling method and is described in the above-mentioned publication, in SPIE, Vol. 1155 Ultrahigh Speed and High Speed Photography, Photonics and Videography '89, pp. 499–510.

According to the described sampling method, the value of the signal at a point of the electronic component, measured during each radiation pulse, is compared with a zero value, i.e. the value of the detection signal during the time intervals during which laser pulses are absent. Thus, a kind of DC measurement is performed. This method has a drawback in that the measurement signal is liable to be influenced by drift in the measurement system. This drift may be caused by drift in the settings of the electronic processing circuit and, notably in the case of an electro-optic measurement device, by variations of the optical properties of the optical components or of the electro-optic crystal, for example, due to temperature variations.

An optimum measurement result is obtained when the electro-optic measurement device mentioned in the preamble of the present description, provided with the constructive innovations disclosed in claims 1 to 8 is further characterized in that it comprises a signal generator (DC) for applying a periodically varying input signal (SI) to the component to be measured, a programmable delay generator (DG) which is connected to an output of said signal generator supplying trigger pulses, a delay modulator (DM) which is connected to the delay generator and which is driven by a periodic modulation signal from a signal source (FG), which modulation signal has a frequency which is lower than that of the periodic input signal (SI), the delay modulator being connected to a radiation source driver circuit (LD) in order to supply this circuit with a number of radiation pulses per period of the modulation signal, which radiation pulses exhibit a first and a second phase relationship relative to the periodic input signal during a first and a second half period, respectively, of the periodic modulation signal, the modulation signal source being connected to a circuit (AM, IM) for processing the detector signals.

In that case the radiation source is controlled so that it successively supplies a number of series of radiation pulses, each series consisting of two sub-series, the pulses of a first sub-series of each series exhibiting a constant phase relationship relative to the periodic test signal, the pulses of the second sub-series of each series exhibiting a constant phase shift relative to the pulses of the associated first sub-series, in each subsequent series the pulses of the second sub-series being phase-shifted relative to the pulses of the second sub-series of the preceding series, for each pulse series the detector signals obtained during the first and the second sub-series of pulses being compared with one another so that one measurement signal value is obtained for each pulse series.

The sampling pulses are additionally modulated in accordance with a frequency which is a few orders of magnitude lower than the frequency of the signal to be measured. The values of the measurement signal measured during the sampling pulses exhibiting a variable phase relationship relative to the periodic test signal are compared with the signal value measured during each of the sampling pulses exhibiting a fixed phase relationship relative to the periodic test signal, the latter signal value acting as a reference. When a large number of measurements is performed during a period of the measurement signal and the mean value is determined, a measurement signal is obtained which is also very reliable.

BRIEF DESCRIPTION OF THE DRAWINGS

The invention will be described in detail hereinafter with reference to the accompanying drawings.

DESCRIPTION OF THE PREFERRED EMBODIMENTS

Figure 1:
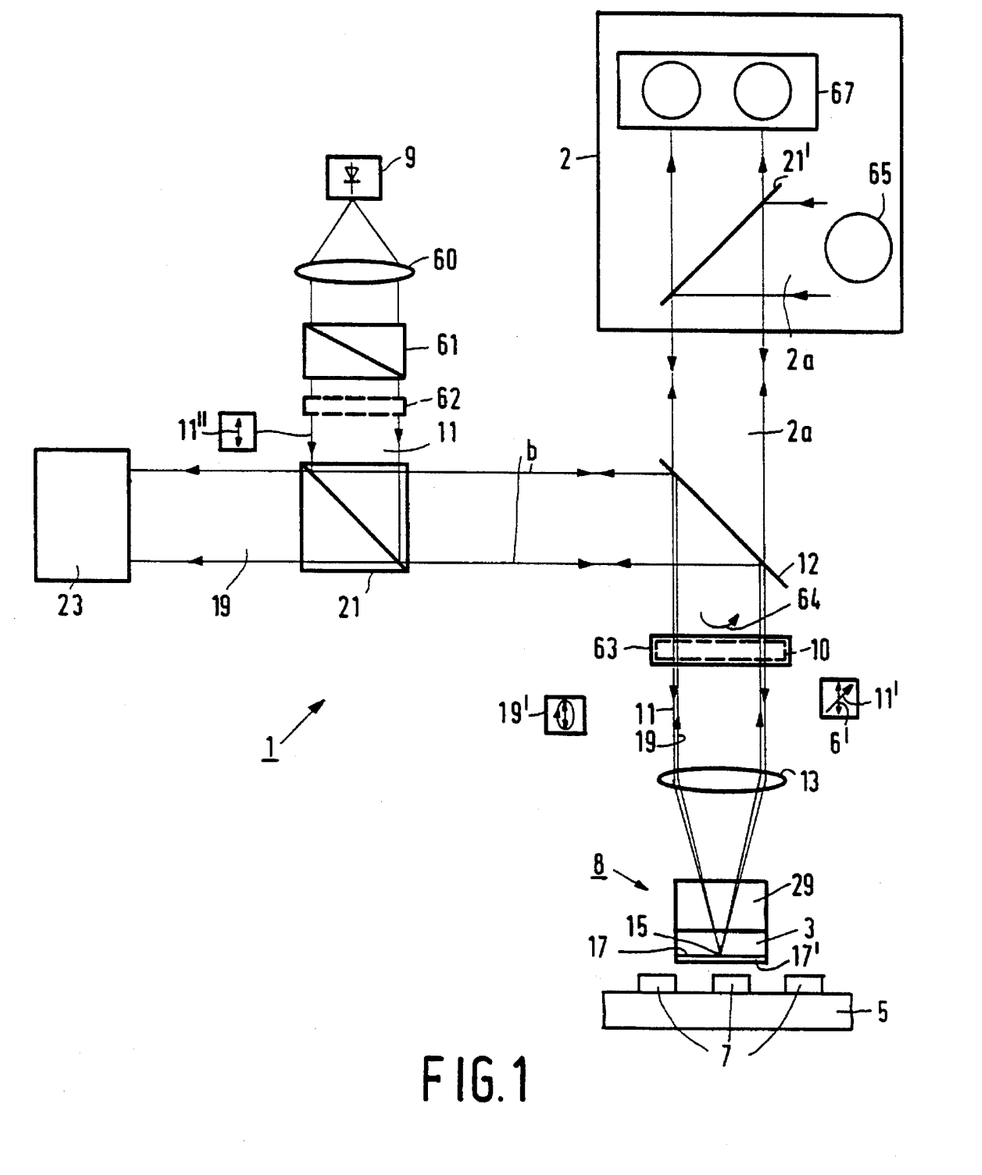
FIG. 1 shows diagrammatically an embodiment of the electro-optic measurement device in accordance with the invention.

The electro-optic measurement device 1 which is the subject of the present invention and whose circuit diagram is shown in FIG. 1 comprises a sensor in the form of an electro-optic crystal 3. The birefringence of such a crystal is changed by application of an electric field across the crystal. The crystal 3 is positioned as near as possible to an object to be investigated or measured. This object may be a semiconductor circuit (IC) 5 comprising a number of electrical conductors 7 or a printed circuit board (PCB). The electric signal propagating through a conductor or a track then generates a local electric field which traverses the crystal and hence changes the birefringence. The signal can subsequently be measured on the basis of the change of the refractive index which is linearly dependent on the value of the electric signal.

The change of the birefringence can be measured by determination of the change of phase of an optical radiation beam applied through the crystal. This radiation beam, originated from a radiation source 9, may be, for example, a linearly polarized beam. Said phase change can be measured in various ways. A first approach utilizes the fact that two propagation modes occur in the crystal and that a phase difference exists between two beam components propagating according to said modes. A second possibility consists in the determination of the phase difference between a measurement beam propagating according to one of the modes and a reference beam propagating outside the crystal.

In the device shown in FIG. 1, the diverging beam supplied by the radiation source 9 is converted into a parallel beam by a collimator lens 60. This beam is incident on a polarizer 61 which transmits a linearly polarized beam component 11 whose polarization direction encloses an angle of 45° relative to the main axis of the electro-optic crystal 3 arranged in an electric field. The polarization direction of the beam 11 is denoted by the arrow 11' and the direction of the main axis is denoted by the reference 6'. In the path of the beam 11 there may optionally be arranged a $\lambda/2$ plate 10, where $\lambda$ is the wavelength of the radiation, in order to adapt the polarization direction of the beam 11 to the crystal.

The beam 11 subsequently reaches, via a polarization-neutral beam splitter 21, a mirror 12 and subsequently an objective system 13 which is diagrammatically represented by a single lens element. The system 13 focuses the beam 11 in a radiation spot 15 on the lower side 17 of the crystal 3. When a 50x objective having a numerical aperture of 0.6 is used, the spot 15 has a diameter of from 1 to 2 μm. Due to the difference between the refractive index of the crystal 3 and that of the ambient air, the beam 11 is at least partly reflected at that area. The reflection can be intensified by providing a reflective layer 17' on the surface 17, for example, as already described in the cited publication. The reflected beam 19 again traverses the crystal 3 and the object system 13, is reflected again by the mirror 12, and is subsequently transmitted by the beam splitter 21 (for example, a semitransparent mirror) to a radiation-sensitive detection system 23.

Should observation of the component 5 be desirable simultaneously with the measurement of the electric signal, the measurement device 1 may be connected to a visual observation system 2. The light beam $2_a$ originating from a source of visible radiation 65 and necessary for illumination of the component 5, is then transmitted, via a beam separation element 21', for example, again a semitransparent mirror, in the direction of the component 5. The mirror 12 should then be replaced by a wavelength-selective element so that the light beam $2_a$ is transmitted to the component 5 and after reflection back to the observation system 2, the beam 19 reflected in the electro-optic crystal 3 being propagated substantially completely in the direction of the detector 23. The objective system 13 images the source 65 in a radiation spot at the area of the measurement point of the laser radiation. This point and its surroundings can be inspected by an observer by means of an eyepiece 67.

Figure 2A:
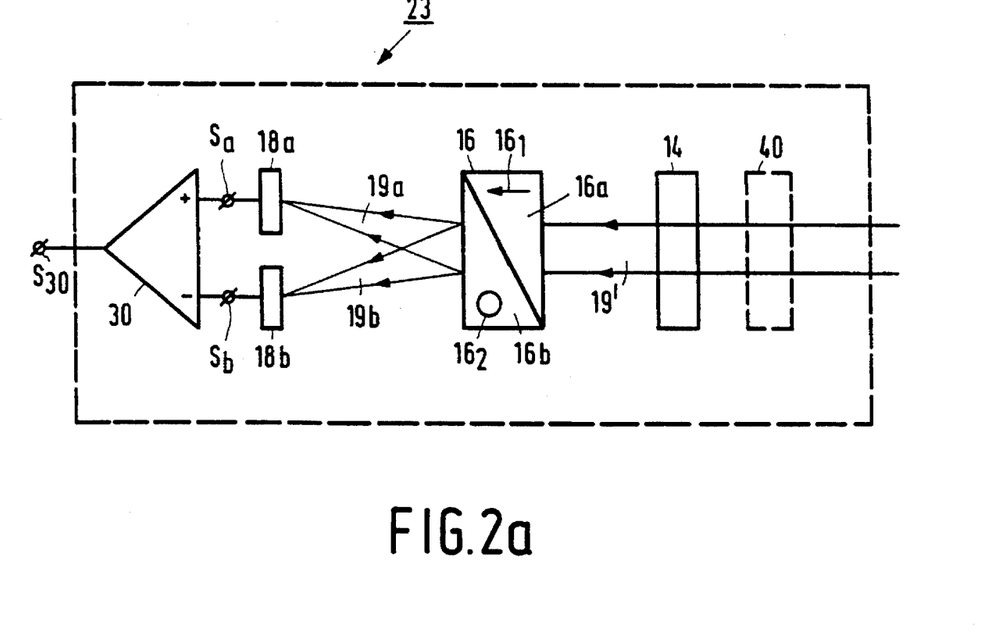
FIG. 2a shows an embodiment of a detection system suitable for use in this measurement device.

Because of the birefringence, the crystal has two propagation modes and the beam entering the crystal is split into components associated with the respective modes. These components travel different optical distances through the crystal, so that the components of the emanating beam 19 exhibit a phase difference. One method of determining this phase difference, which is dependent on the signal to be measured, is described in the article: "Integrated Circuit Diagnostic Tools: Underlying Physics and Applications", Philips Journal Research, Vol. 44, N° .⅔, 1989, pages 295–327, notably in Section 2.4: "Electro-optic sampling". The detection system 23 may be formed by a λ/4 plate 14, succeeded by a Wollaston prism 16, two radiation sensitive detectors $18_a$, $18_b$, and a differential amplifier 30, as shown in FIG. 2a. The C-axis of the λ/4 plate 14 preferably extends parallel to the main axis of the crystal 3, so that the phase difference between the two components is increased by a constant factor π/2. It is thus achieved that the zero point of the measurement is shifted along the curve representing the intensity difference as a function of the phase difference, so that this point is situated halfway on a slope of maximum steepness. As a result, a small phase difference results in a comparatively large difference in intensity on the detectors so that the sensitivity of the device is maximum.

The Wollaston prism 16 splits the beam into two sub-beams $19_a$, $19_b$ having mutually perpendicular polarization directions, the intensity distribution between the sub-beams being determined by the polarization condition of the beam 19'. The sub-beams $19_a$ and $19_b$ are intercepted by separate detectors $18_a$ and $18_b$. The output signals $S_a$ and $S_b$ thereof, being proportional to the intensity of the sub-beam $19_a$ and the sub-beam $19_b$, respectively, are applied to the inputs of a differential amplifier 30, the output detection signal $S_{30}$ of which is proportional to the signal to be measured on one of the conductors 7 of the component 5. The output signal $S_{30}$ is zero if the conductor does not carry a signal. The λ/4 plate 14 in the detection chain may also be replaced by a λ/4 plate 62 between the polarizer 61 and the beam splitter 21. The beam entering the electro-optic crystal is then circularly polarized and is not influenced by the orientation of the crystal. In order to achieve the above constant phase shift of π/2 rad between the beam components, the Wollaston prism 16 is preferably rotated, together with the detectors $18_a$ and $18_b$, relative to the position occupied in the original arrangement of FIG. 1.

When the component 5 to be examined and the crystal 3 are moved relative to one another, for which purpose the component 5 may be arranged, for example, on a table which is movable in two directions, measurements can be performed at any desired point of the component 5 and the local behaviour of and defects in the component 5 can be detected.

Figure 2B:
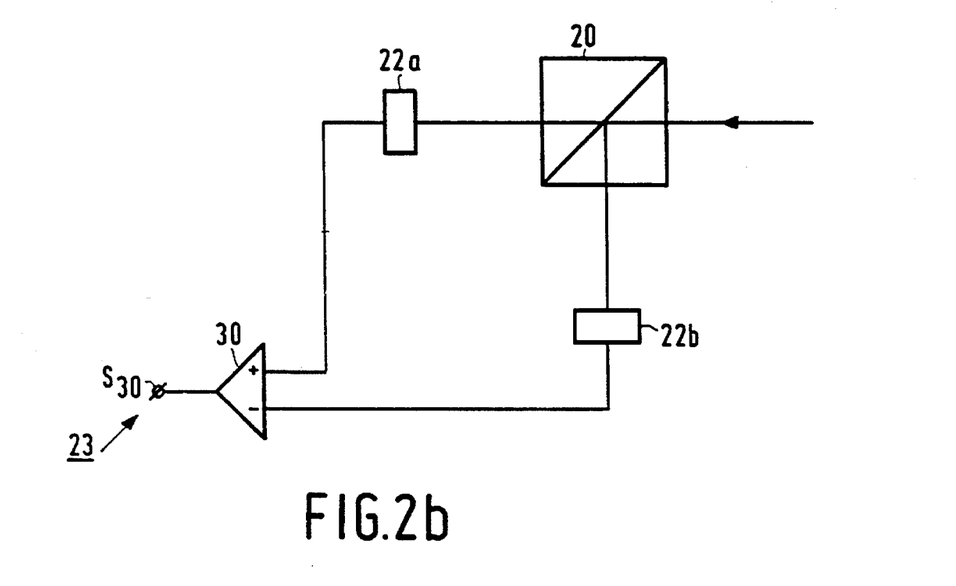
FIG. 2b shows a first alternative embodiment for the detection system shown in FIG. 2a and suitable for use in the measurement device in accordance with the invention.

FIG. 2b shows an alternative embodiment of the detection system 23. The Wollaston prism 16 has been replaced by a polarization-sensitive beam splitter 20 which splits the beam to be analyzed into two sub-beams, each of which is intercepted by a detector $22_a$, $22_b$. The signals of these detectors are again applied to a differential amplifier 30.

The detection system 23 may also include a compensator 40 denoted by a dotted line (in FIG. 2a) in order to compensate for the intrinsic birefringence of the electro-optic crystal, i.e. the birefringence exhibited by the crystal in the absence of an electric field. Such a compensator 40, which is used if the crystal is, for example, a $LiTaO_3$ crystal, may consist of a birefringent element which introduces a phase difference between the components of the beam 19 which is equal but opposite to the phase difference caused by the intrinsic birefringence of the crystal.

The extent of the birefringence induced in the electro-optic crystal is determined to a substantial degree by the choice of the crystal material. As is known from the cited publication in Philips Journal Research Vol. 44, 1989, pages 295–327, two kinds of electro-optic crystals can be used for the measurements discussed herein, i.e. crystals having a so-called longitudinal geometry and crystals having a so-called transverse geometry. In a crystal having a longitudinal geometry, only the electric field component which is parallel to the propagation direction of the light beam 11 entering the crystal 3 influences the optical properties of the crystal 3. In order to obtain an adequate effect, an electro-optic material should be chosen which becomes a birefringent crystal upon application of an electric field, said crystal having an optical axis which does not extend parallel to the light beam. This condition limits the number of feasible crystals of longitudinal geometry. Materials exhibiting a cubic symmetry, for example, GaAs and $Bi_{12}SiO_{20}$ (BSO), are particularly suitable in this respect. Despite the fact that the electro-optic effect is weak in some of these crystals, for example, in BSO, such cubic materials offer the advantage that no intrinsic birefringence occurs and hence no variation thereof can occur in response to a temperature variation. Consequently, no correction for these phenomena is necessary and a compensator 40 can be dispensed with in the detection system 23. In a crystal having transverse geometry, the component of the electric field which extends perpendicularly to the light beam 11 has an effect. The optical axis of the crystal 3 should then be situated in a plane perpendicular to the light beam 11. An example in this respect is $LiTaO_3$. This material is uniaxial in the absence of an electric field and the optical properties are determined mainly by the component of the electric field along the optical axis. For the applications described herein crystals having a longitudinal geometry are to be preferred. This is because in the case of transverse geometry the problem of cross-talk between neighbouring tracks 7 is more pronounced. In the case of longitudinal geometry, however, the field above the relevant track mainly is measured so that the risk of cross-talk is small.

For the radiation source 9 use can be made of a laser as has already been stated. One possibility is the use of a semiconductor laser, offering the advantage that it is compact, as is also known from the cited publication by S. Aoshima et al. An alternative consists in the use of a gas laser, a liquid laser or a solid state laser. The wavelength of the laser used is codetermined by the wavelength transmission range of the electro-optic crystal 3 used.

Figure 3A:
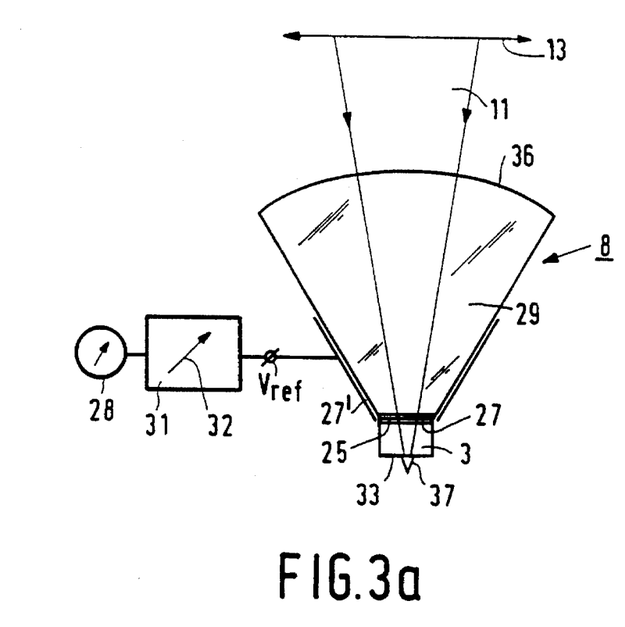
FIGS. 3a, 3b and 3c show a first, a second and a third embodiment of a measurement tip suitable for use in a measurement device in accordance with the invention.
Figure 3B:
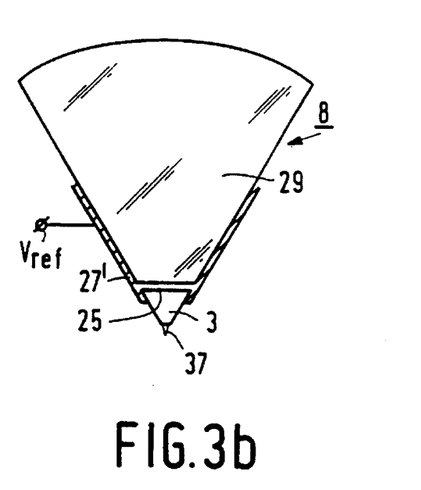

By using a novel measurement probe in accordance with the invention, the quality of the measurement can be improved in a number of respects and also a new measurement method can be used. FIGS. 3a and 3b show two embodiments of the measurement probe. As in the known measurement probe, a transparent, electrically conductive layer 27 may be provided on the upper side 25 of the electro-optic crystal 3. The layer 27 is connected to an electrically conductive layer 27' on the circumference of the carrier means 29. This layer 27, acting as an electrode, may be made of, for example, indium tin oxide and be provided on the lower portion of a radiation-transparent carrier means 29 by sputtering. The electrode 27' carries a reference voltage $V_{ref}$. The reference voltage may be zero, which means that the electrode is grounded. The electric field across the crystal 3 is then determined by the electric field generated by the signal to be measured. The electrode 27' may alternatively be connected to a voltage source 31 so that the signal to be detected is measured relative to a fixed reference voltage.

FIG. 3b shows an embodiment of the measurement probe without radiation-transparent electrode 27. For customary dimensions of the measurement probe it is alternatively possible to use only the circumferential electrode 27' to achieve that the potential across the upper side 25 of the electro-optic crystal 3 is sufficiently defined by the reference voltage $V_{ref}$, certainly so if the electrode 27' also extends across a portion of the circumference of the crystal as shown in FIG. 3b.

The voltage source 31 is preferably adjustable as diagrammatically denoted by the arrow 32. In accordance with the invention, the reference voltage can be adjusted on the basis of the detector signal measured; in other words, feedback control can be applied. In that case such a reference voltage $V_{ref,c}$ can be applied to the electrode 27 that the signal $S_{30}$ (FIG. 2) equals zero. In that case an electric field is no longer present across the crystal 3 and the voltage across the lower side 17 of the crystal 3 equals the reference voltage across the upper side 25. The value of $V_{ref,c}$ can be determined as diagrammatically denoted by the meter 28 and is a measure of the value of the signal to be measured.

The resolution of the measurement device 1 is restricted not only by the optical resolution but also by the expanse of the electric field generated by a signal in a conductor 7. The birefringence of the crystal 3 can be influenced not only by the electric field of the signal at the point being measured at a given instant, but also by electric fields of signals in neighbouring conductors or points, in other words cross-talk between the signals may occur. This effect is even stronger when the surface of the component 5 is irregular so that the distance between the lower side of the crystal and the component to be examined varies.

By imparting a conical shape to the crystal 3, as is known per se from the publication "Electro-optic sampling using an external GaAs probe tip" by M. Shinagawa and T. Nagatsuma in Electronics Letters, August 1990, Vol. 26, No. 17, pages 1341–1343, not only is the risk of cross-talk reduced, but various points of a component or circuit exhibiting height variations can also be suitably accessed. Moreover, the weight of the sensor is thus reduced so that the mechanical loading of the circuit is also reduced. In accordance with the cited publication, a tip diameter of 100 μm is used. By application of improved shaping techniques, the diameter of the apex of the cone in the device in accordance with the invention can be 25 μm.

In the measurement device in accordance with the invention which is suitable for executing calibrated amplitude measurements, thus substantially reducing the risk of cross-talk, on the lower side 17 of the electro-optic crystal 3, being shaped as a cone or not, there is provided an electrically conductive tip-shaped element which is denoted by the reference 37 in the FIGS. 3a and 3b. When this tip 37 is in contact with a conductor 7 to be measured, the voltage across the lower side 17 of the crystal 3 is determined directly, and hence in intensified and predominant manner, by the signal in the relevant conductor 7, so that the effect of signals in neighbouring conductors is greatly reduced. Moreover, the signal $S_{30}$ measured is then directly associated with the signal to be measured, so that calibration is not necessary.

If the conductive tip 37 cannot contact the conductor 7 to be measured, due to the presence of insulating layers on the upper side of the integrated circuit 5, adequate reduction of cross-talk can be achieved by making the distance between the tip 37 and the conductor 7 smaller than the distance between this conductor and neighbouring conductors.

The tip-shaped element may consist of various conductive materials such as doped silicon, tungsten or a metal. The advantage of tungsten resides in its high mechanical strength. Because tungsten is not reflective, a reflective layer should be provided on the lower side of the crystal 3 when a tungsten tip is used.

A major advantage of a metal tip 37 consists in that the tip itself is reflective so that it is not necessary to provide a reflective layer 17' on the lower side 17 of the crystal 3. Moreover, because only the metal tip 37 is reflective, the effective size of the radiation spot wherefrom the beam 19 originates is then determined by the diameter of the base of the metal tip 37 which is, for example, 2 μm, so that in principle less severe requirements need be imposed on the optical imaging system.

However, for an as efficient as possible use of the available radiation, in accordance with a further aspect of the invention the radiation spot 15 is made as small as possible. Even though the beam 11 can be focused so as to form a small, preferably diffraction-limited radiation spot having a diameter in the order of magnitude of 1 μm by means of a suitable objective system 13, additional refraction occurs at the carrier entrance face when use is made of a conventional carrier means 29 (FIG. 1), which refraction leads to aberrations in the measurement beam 11 and to an enlarged radiation spot 15. In accordance with the invention, this enlargement of the spot is prevented by imparting a special shape to the carrier means 29 as shown in FIG. 3a. The carrier means 29 is shaped as a sector of a sphere whose centre of curvature coincides with the point on the lower side 17 of the crystal 3 where the main ray of the measurement beam 11 strikes the lower side 17. As a result of this shape all rays of the beam 11 traverse the entrance, face 36 of the carrier means 29 without refraction, the reflection from this face being minimized. By matching of the refractive indices of the holder material, for example glass, of the electrode 27 and of the electro-optic crystal 3, it can be assured that as few as possible reflections occur at the interfaces between these three elements.

The carrier means 29 in the form of a sector of a sphere may be mounted on the objective system 13.

Figure 3C:
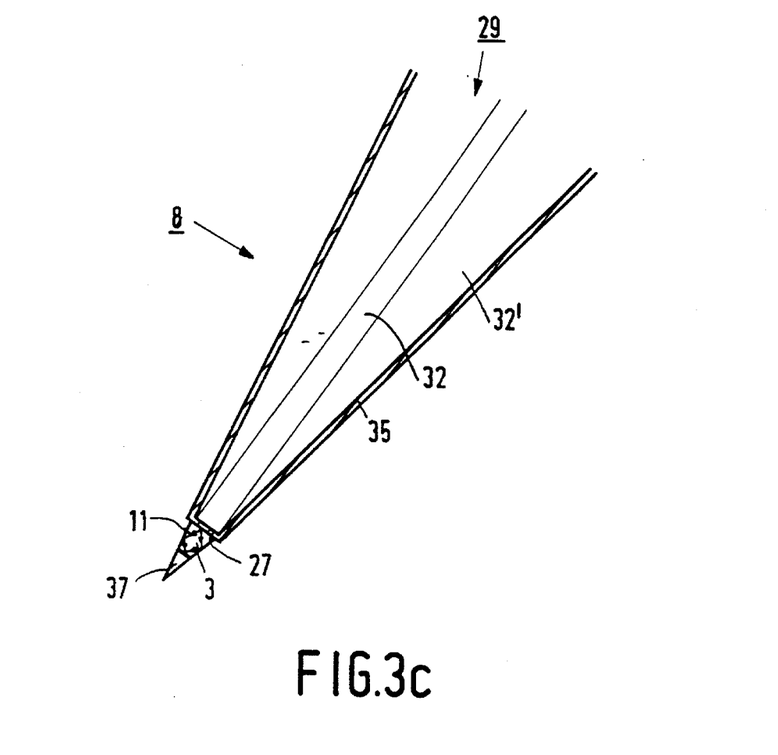

FIG. 3c shows a second embodiment of a special radiation-conductive carrier means 29 for the electro-optic crystal 3 which enables a radiation spot 15 of minimum dimensions to be obtained and which also protects the measurement radiation against ambient influences. This means 29 is formed by an optical fibre having a core 32 and a conically tapered sheath 32', radiation from a radiation source (not shown) being applied to said fibre 29 in known manner via a couple-in optical system (not shown either). When the birefringence of the crystal 3 is determined on the basis of the polarization change of a linearly polarized radiation beam, use is preferably made of a polarization-sustaining fibre in order to prevent influencing of the polarization condition of the radiation propagating in the fibre 29. When the electro-optic crystal 3 has a conical shape, the beam 11 emanating from the fibre 29 is concentrated onto the tip 37 due to total reflections at the transitions between the electro-optic material and the surrounding medium, for example, air. If necessary, the fibre 29 is fully or partly covered by a metal layer 35 which is coextensive with an electrode 27 and to which a reference voltage can be applied.

Figure 4:
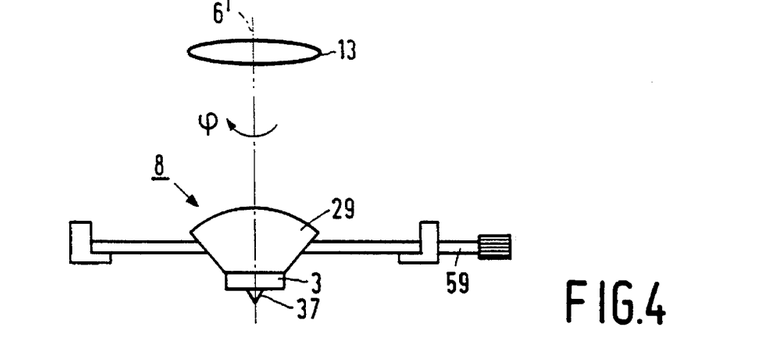
FIG. 4 shows diagrammatically how the measurement probe of FIG. 3a can be included in an xyz manipulator.

The carrier means 29 in the form of a sector of sphere as shown in FIG. 3a as well as the end of the fibre shown in FIG. 3c may be mounted in an X, Y, Z manipulator 59 as shown by way of example for the carrier means 29 in FIG. 4. This manipulator enables fine adjustment of the sensor in said three directions.

Figure 5:
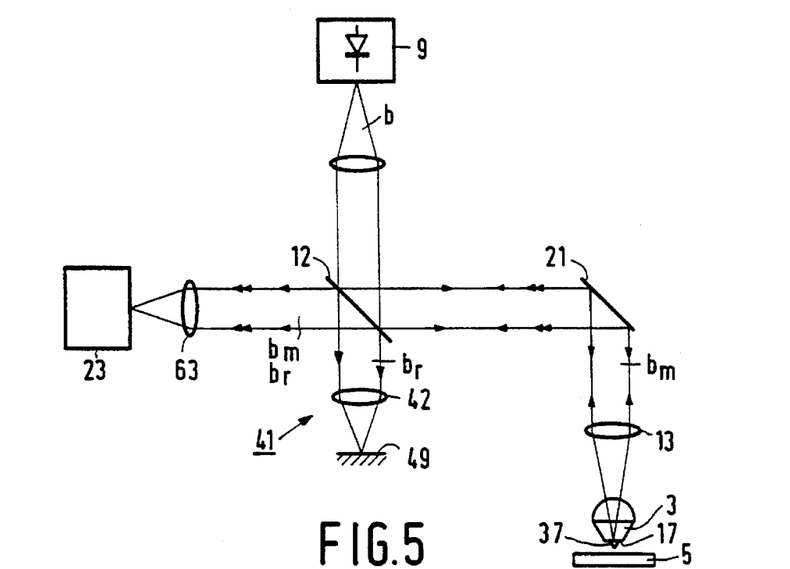
FIG. 5 shows a first embodiment of the measurement device in accordance with the invention in which the phase variation is determined by interferometry.

Another possibility for determining the birefringence of the crystal consists in the measurement of the phase shift, caused by the electro-optic crystal, in a measurement beam propagating according to one of the modes associated with the crystal. Such a phase shift can be measured by way of interferometry. FIG. 5 shows a first embodiment of the device 1 in which this possibility is used. The beam b supplied by a laser source 9 is split into a measurement beam $b_m$ and a reference beam $b_r$ by a beam splitter 12. The measurement beam $b_m$ is focused onto the lower side 17 of the electro-optic crystal 3 via a mirror 21 and the objective 13. The reflected measurement beam follows the same path in the reverse direction and a part of the measurement beam reaches, via the beam splitter 12, the detector 23 on which it is focused by a lens 63.

The reference beam $b_r$ transmitted by the beam splitter 12 is incident on a reflector 41 which is constructed, for example, as a cat's eye formed by a lens 42 and a mirror 49 arranged at the point of focus thereof. The beam reflected by the mirror 49 is combined with the reflected measurement beam by the beam splitter 12 and is applied, together therewith, to the detector 23 where the measurement beam and the reference beam interfere. It can be ensured that, in the absence of an electric field across the electro-optic crystal, the optical path length, i,e., the product of the geometric path length and the refractive index of the medium being traversed, of the measurement beam and the reference beam deviate by $\lambda/4 + n.\lambda/2$, where n is an integer, so that the phase difference between the two beams equals $\pi/2$ rad. As has already been described with reference to FIG. 1, the sensitivity of the measurement device is then maximum.

When the refractive index of the electro-optic crystal changes, the phase of the measurement beam is shifted with respect to that of the reference beam and the radiation intensity on the detector 23 changes due to interference of the two beams.

Figure 6:
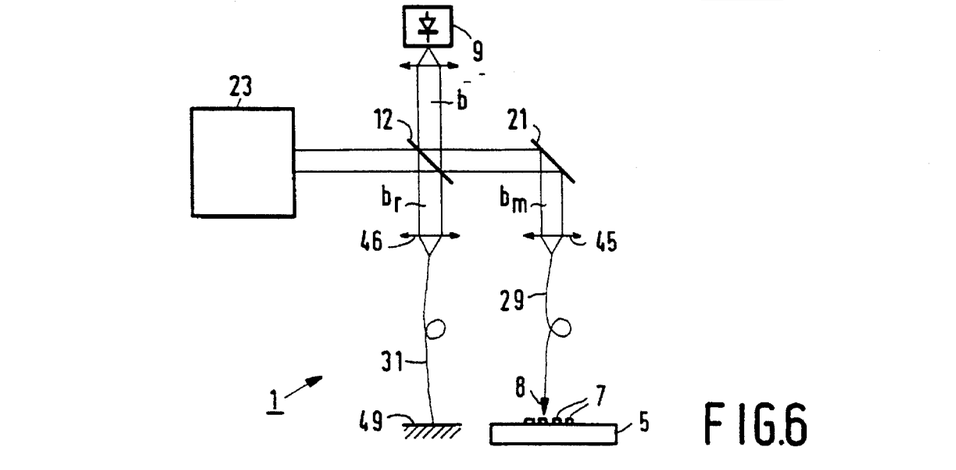
FIG. 6 shows a second embodiment of the measurement device in accordance with the invention in which the phase variation is determined by interferometry.

The principle of the device 1 shown in FIG. 5 is preferably realized by means of optical fibres as shown in FIG. 6. The measurement beam $b_m$ is conducted by the carrier means 29, in this case a measurement fibre, and the reference beam $b_r$ is conducted by a reference fibre 31. The lenses 45 and 46 ensure that as much radiation as possible is coupled into the fibres 29 and 31, respectively. Because the measurement beam and the reference beam axe coupled into the fibres 29, 31, they axe substantially not influenced by the surroundings. The use of fibres also offers the advantage that a high degree of freedom is achieved in designing the measurement device.

A measurement device of the described kind can be used, for example, for testing whether or not a transistor or an integrated circuit or a PCB exhibits the desired behaviour. Furthermore, such a device can be used to trace undesirable delays in the circuit and to analyse the behaviour of a signal traversing a circuit.

Because the magnitude of the effects generated in the electro-optic crystal is usually small, preferably a so-called dynamic detection method is used. This means that an additional modulation which is independent of the signal to be measured is imparted to the measurement signal. Such a dynamic detection offers the advantage that the measurement result is not influenced, or influenced to a substantially lesser extent, by, for example, drift in the electronic processing circuit, laser drift or changes in the properties of the optical components due to, for example, temperature variations.

The dynamic detection can be realized in various ways, for example, by modulation of the test signal which is applied to the component to be measured and by synchronous detection of the detector signal and the test signal.

In accordance with the invention, dynamic detection can be achieved by modulation of the polarization condition of the beam entering the crystal. This can be achieved by means of a rotating $\lambda/2$ plate arranged in the path of this beam. Continuous rotation of such a plate periodically rotates the polarization direction of the beam emerging from the plate at a fixed frequency, i,e, twice the frequency of rotation of the plate. The intensity distribution between the sub-beams $19_a$ and $19_b$ (FIG. 2a) thus varies periodically and hence also the signal $S_{30}$ from the differential amplifier 30.

The rotating $\lambda/2$ plate may be arranged merely in the path of the beam 11 (FIG. 1). Preferably, however, this plate 63 is arranged in the position of the previously mentioned $\lambda/2$ plate 10 used to match the polarization direction of the beam 11 to the crystal 3. The polarization direction of the detected measurement beam is then rotated at four times the angular frequency of the plate 63. In FIG. 1 the direction of rotation is denoted by the arrow 64. The polarization direction of the beam 11 can be adapted to the crystal by adjustment of the zero position of the plate 63, so that this plate can also perform the function of the plate 10.

Figure 7:
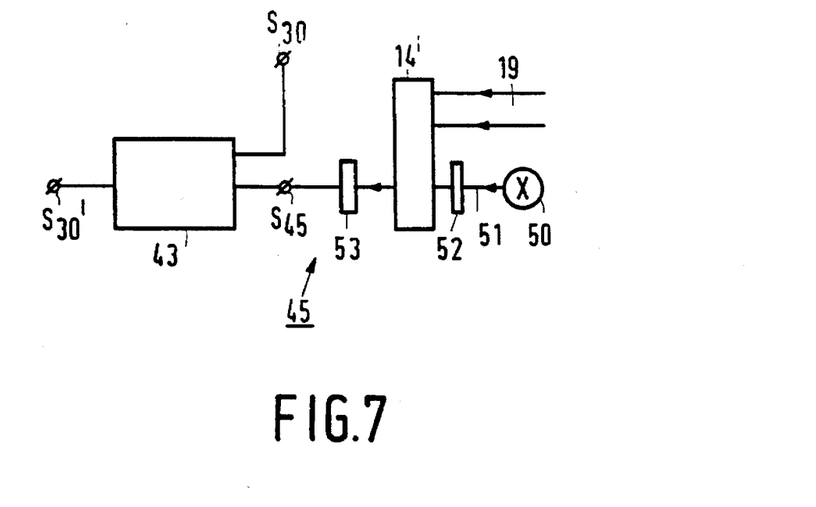
FIG. 7 shows an embodiment of a position detection system suitable for use in an embodiment of the measurement device whereby dynamic detection is performed.

As is shown in FIG. 7, the detector signal $S_{30}$ is applied to a synchronous detection circuit 43 which also receives the signal $S_{45}$ from a position detection system 45 and in which the signal $S_{30}$ is demodulated by means of the signal $S_{45}$, thus forming a signal $S_{30}'$, whose value is determined exclusively by the signal at the measurement point of the object. The position detection system 45 supplies a periodic signal having a frequency equal to twice the frequency of rotation of the plate 14' and may be derived from the control signal whereby the motor (not shown) for rotating the plate 14' is driven. The position detection system 45 may be constructed, for example, as shown in FIG. 7 and comprises an auxiliary radiation source 50 which supplies an auxiliary beam 51, a polarizer 52 which transmits a linearly polarized component of the beam emitted by the source, and an auxiliary detector 53 which is preferably a photo diode. The beam 51 may also be derived from the radiation source 9 (FIG. 1). Upon rotation of the $\lambda/2$ plate, the detector supplies a periodic, sinusoidal signal $S_{45}$. Instead of an optical position detection system, use can alternatively be made of an inductive or capacitive position detection system.

In order to enable determination of the variation in time of the signal, i.e. the waveform, at a point of the component to be measured, it is necessary to perform a sampling measurement. To this end, use is preferably made of a pulsed measurement beam. In the described electro-optic measurement device, the radiation source 9 can be pulsed for this purpose, the duration of the pulses being substantially shorter than the period of the test signal, the starting instants of the successive pulses exhibiting an increasing delay relative to the associated period of the test signal. The temporal resolution is then determined by the pulse duration, provided that the latter is greater than the response time of the electro-optic crystal. The pulse duration may be in the order of magnitude of tens of picoseconds. Such a sampling method is disclosed in the cited article: "Integrated Circuit Diagnostic Tools", Philips J. Res. 41 (1989), pages 307–312.

An optimum measuring result can be achieved with the above-described electro-optic measurement device by using time delay modulation as a sampling method.

Figure 8:
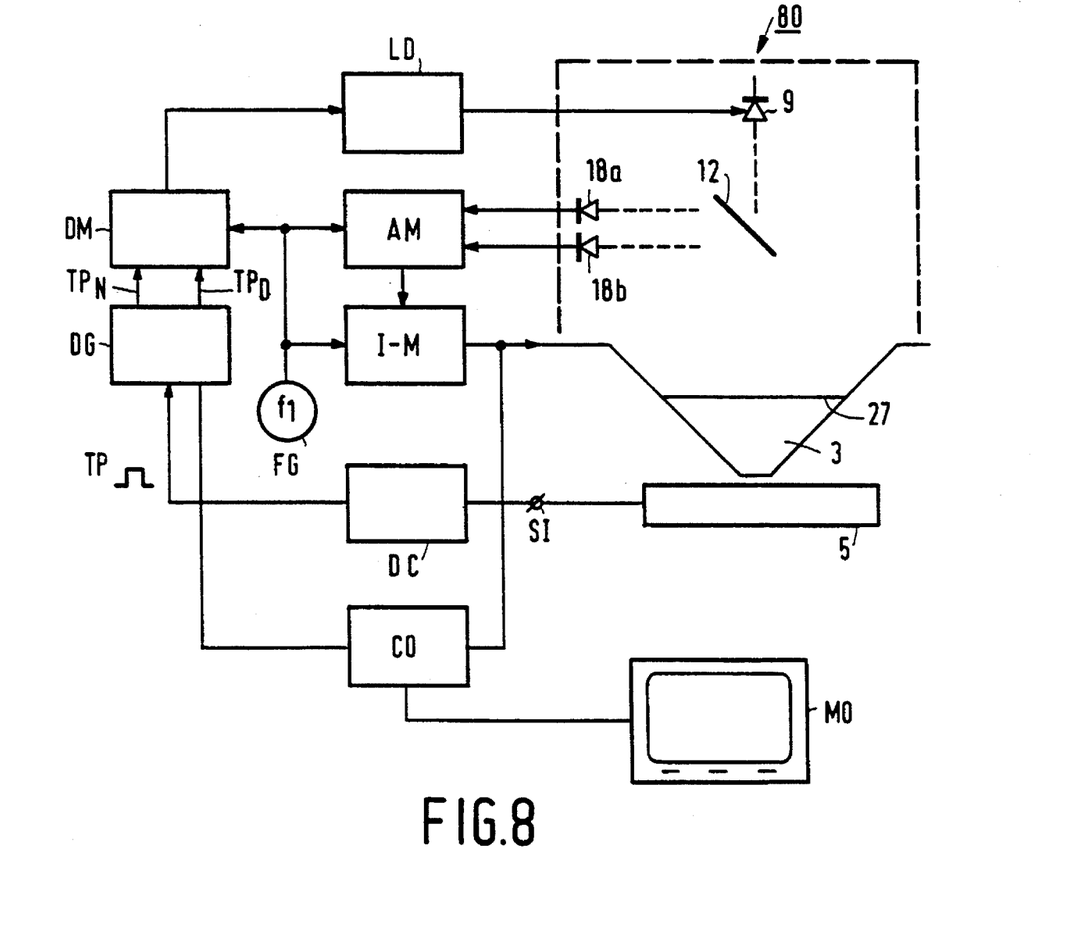
FIG. 8 shows diagrammatically an embodiment of the measurement device in accordance with the invention in which a sampling method is used.
Figure 9:
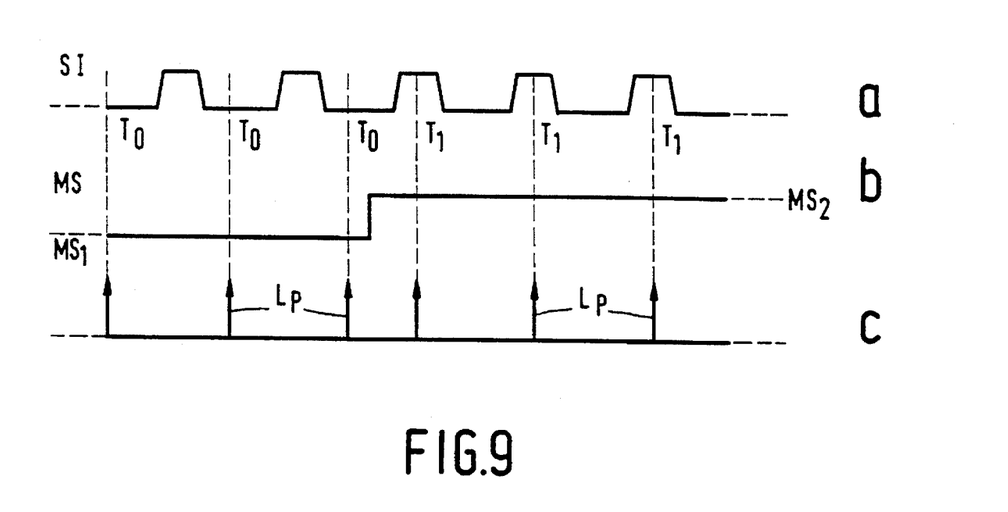
FIGS. 9a, 9b and 9c illustrate the principle of the sampling method on the basis of the signals used.

FIG. 8 shows diagrammatically an embodiment of a device in accordance with the invention in which the time delay modulation method can be used, and the FIGS. 9a, 9b and 9c illustrate its principle on the basis of the signals used. The device comprises a drive circuit DC which supplies an input or test signal SI, for example, a squarewave signal having a frequency of 10 MHz, for the electronic component 5 to be measured. The circuit DC also applies trigger pulses TP to a programmable delay generator DG. This generator is followed by a delay modulator DM which operates at a fixed frequency $f_1$ in the range of, for example, from 2 to 20 kHz of a frequency generator FG. The modulation signal MS for the delay modulator is shown in FIG. 9b, and FIG. 9a shows the input signal SI. The delay generator DG comprises a first output and a second output which supply delayed and non-delayed trigger pulses $TP_d$ and $TP_n$, respectively. The delay modulator DM conducts nondelayed pulses at the instants $T_O$ during a first half period $MS_1$ of the modulation signal MS, and conducts delayed pulses during the second half period $MS_2$. It is to be noted that FIG. 9b shows only a small part of one period of the modulation signal MS.

The radiation source 9 may be a diode laser which can be controlled by an external signal having a frequency of, for example, 10 MHz, via a laser drive LD which is connected to the output of the delay modulator DM. Per period of the signal SI the diode laser then supplies one laser pulse Lp (see FIG. 9c), the laser pulses Lp appearing at fixed instants $T_O$ during the first half period of the modulation signal MS; during the second half period of the signal MS they appear at instants $T_1$ which are adjustable via the delay generator DG.

The laser pulses traverse the electro-optic measurement device which is diagrammatically represented by the block 80 in FIG. 8 and a detailed embodiment of which is shown in FIG. 1. The output signal of the detection system is applied to a so-called lock-in amplifier AM. When two detectors $18_a$ and $18_b$ are used, a lock-in amplifier is used which comprises a differential input to which the modulation signal MS is also applied and whose output is connected to the input of a circuit I-M.

The detected signal is integrated in this circuit. In the preferred feedback or zero point measurement, the output signal of the circuit I-M is fed back to the electrode 27 so as to be used as a reference voltage. In the circuit I-M the signal is also modulated, using the modulation frequency of the signal MS, between a zero level and the measured level. When the signals of the detectors $18_a$ and $18_b$ are equal, the output signal of the differential amplifier equals zero and the output signal of the integrator is constant. The output voltage of the integrator is then a measure of the signal SI at the instants $T_1$ if the signal SI is zero at the instants $T_0$. If the signal SI has a different value at the instants $T_0$, the zero level of the integrator output signal is shifted. The amplitude of this signal is still calibrated, because a zero point method is used.

The measurement of the signal at the instant $T_1$ is performed a large number of times because of the large number of laser pulses within the half period $MS_2$ of the modulation signal MS. This number of pulses amounts to, for example, one thousand when the frequency of the signal SI is 10 MHz and that of the modulation signal MS is 10 kHz. A reliable measurement signal is obtained at the instant $T_1$ when an average is taken over such a large number of measurements. This measurement signal is compared with the mean signal of an equally large number of measurements at the instants $T_0$.

After the execution of a first mean measurement at a first instant $T_1$ in this manner, the delay of the generator DG is slightly changed, for example, in the order of magnitude of two hundred picoseconds, and a second mean measurement is executed at a second instant $T_1$. Thus, using the laser pulses Lp having a brief duration of, for example, fifty picoseconds, one period of the periodic signal at a measurement point of the electronic component 5 can be sampled.

Figure 10:
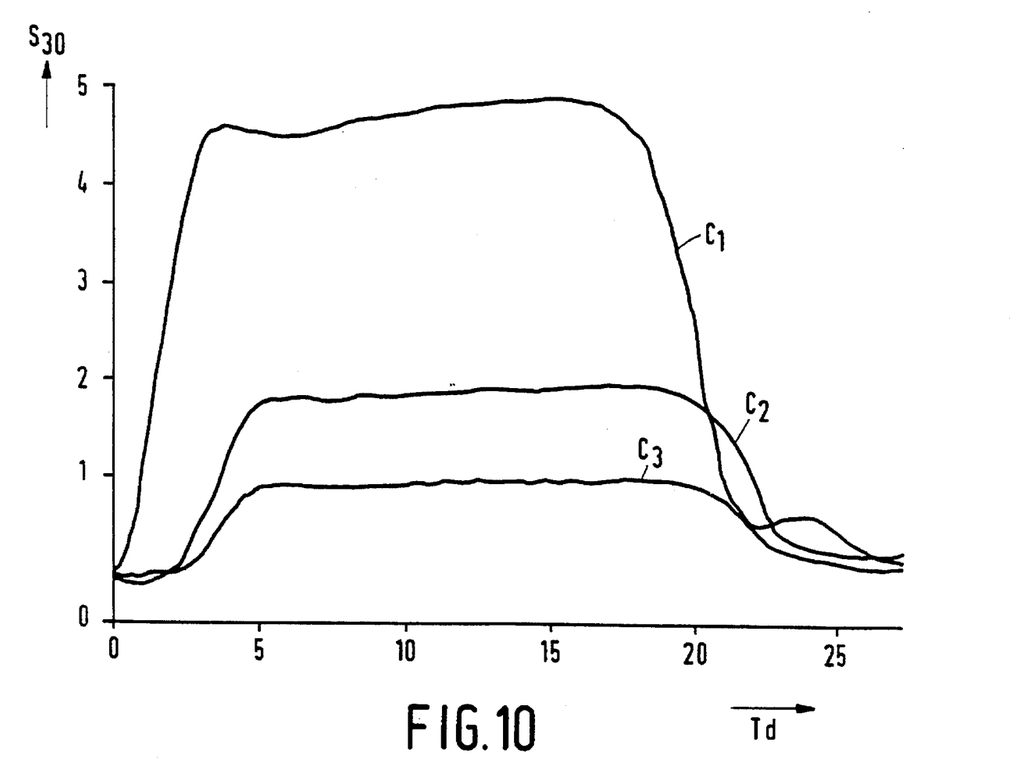
FIG. 10 shows some calibrated amplitude measurements.

FIG. 10 shows the result of such a measurement for a track having a width of 8 µm. In this Figure the delay $T_d$ is plotted in nanoseconds in the horizontal direction and the measured signal $S_{30}$ is plotted in the vertical direction. The curves $C_1$, $C_2$ and $C_3$ are associated with amplitudes of the output signal SI amounting to 5V, 2V and 1V, respectively, the repetition frequency of the laser pulse being 10 MHz.

The device shown in FIG. 8 also comprises a computer CO for programming the delay $T_d$ of the generator DG, for measuring and storing the output signal of the integrator, and for controlling a display device MO for the waveform.

In the device shown in FIG. 8, the voltage across the electrode 27 is modulated in synchronism with the time delay modulation. This also holds if the input signal SI is modulated.

We claim:

1. An electro-optic measurement device for optically measuring an electric signal in an electronic component, comprising: a radiation source for supplying an optical radiation beam, a sensor comprising an electro-optic crystal mounted on a transparent carrier means, an optical system arranged between the radiation source and the crystal in order to focus the radiation beam in a radiation spot on a first side of the crystal which faces the component to be measured, and a detection system for converting a change of phase in the radiation beam, produced by the electro-optic crystal due to birefringence induced in the crystal by the electric signal, into an electric detection signal, wherein an electrically conductive, tip-shaped element is provided on the first side of the electro-optic crystal.

2. An electro-optic measurement device as claimed in claim 1 the carrier means comprises an element of a radiation-transparent material which is shaped as a sector of a sphere, having a of curvature which is coincident with the point of intersection of a main ray of the radiation beam and a second side of the crystal.

3. An electro-optic measurement device as claimed in claim 2 wherein the carrier means is secured to an xyz manipulator.

4. An electro-optic measurement device as claimed in claim 2, in which the optical system comprises an objective system, wherein the carrier means is secured to the objective system.

5. An electro-optic measurement device as claimed in claim 1, in which the optical system comprises an objective system, wherein the carrier means is secured to the objective system.

6. An electro-optic measurement device as claimed in claim 1 wherein the carrier means comprises a radiation-conductive fibre having an entrance face which faces the radiation source and an exit face which is connected to the electro-optic crystal.

7. An electro-optic measurement device as claimed in claim 6, wherein the carrier means is secured to an xyz manipulator.

8. An electro-optic measurement device as claimed in claim 1, wherein a partly transparent element is arranged in a path between the radiation source and the sensor in order to split a beam supplied by the radiation source into a measurement beam which is directed towards the electro-optic crystal and a reference beam which is directed towards a reference reflector, and to combine the reference beam and the measurement beam after reflection.

9. An electro-optic measurement device as claimed in claim 8, wherein radiation-conductive fibre is arranged in at least one of respective beam paths between the partly transparent element and the electro-optic crystal and the reference reflector.

10. The electro-optic measurement device as claimed in claim 8 wherein said reference beam and said measurement beam are received by said detection system, and said detection system includes interferometer measurement apparatus.

11. An electro-optic measurement device as claimed in claim 1, wherein a rotatable $\lambda/2$ plate is arranged in the path of the beam travelling to the electro-optic crystal, $\lambda$ being the wavelength of the radiation beam.

12. An electro-optic measurement device as claimed in claim 1 which further comprises; a signal generator (DC) for applying a periodically varying input signal (SI) to the component to be measured, a programmable delay generator (DG) connected to an output of said signal generator supplying trigger pulses, a delay modulator (DM) which is connected to the delay generator and which is driven by a periodic modulation signal from a modulation signal source (FG), which modulation signal has a frequency which is lower than that of the periodic input signal (SI), the delay modulator being connected to a radiation source driver circuit (LD) in order to supply said circuit with a number of radiation pulses per period of the modulation signal, which radiation pulses exhibit a first and a second phase relationship relative to the periodic input signal during a first and a second half period, respectively, of the periodic modulation signal, the modulation signal source being connected to a circuit (AM, IM) for processing the detector signals.

13. An electro-optic measurement device for optically measuring an electric signal in an electronic component, comprising: a radiation source for supplying an optical radiation beam, a sensor comprising an electro-optic crystal mounted on a transparent carrier means, wherein a portion of the carrier means which faces the crystal is provided with an electrode for applying a reference voltage to the crystal, an optical system arranged between the radiation source and the crystal in order to focus the radiation beam in a radiation spot on a first side of the crystal which faces the component to be measured, and a detection system for converting a change of phase in the radiation beam, produced by the electro-optic crystal due to birefringence induced in the crystal by the electric signal, into an electric detection signal, wherein an electrically conductive, tip-shaped element is provided on the first side of the electro-optic crystal.

14. An electro-optic measurement device as claimed in claim 2, wherein the reference voltage comprises an output voltage of an electronic processing circuit, having an input is connected to an output of the detection system.

15. An electro-optic measurement device as claimed in claim 13, wherein the carrier means comprises an element of a radiation-transparent material which is shaped as a sector of a sphere having a centre of curvature which is coincident with the point of intersection of a main ray of the radiation beam and a second side of the crystal.

16. An electro-optic measurement device as claimed in claim 13, in which the optical system comprises an objective system, wherein the carrier means is secured to the objective system.

17. An electro-optic measurement device as claimed in claim 13, wherein the carrier means comprises a radiation-conductive fibre having an entrance face which faces the radiation source and an exit face which is connected to the electro-optic crystal.

18. An electro-optic measurement device for optically measuring an electric signal in an electronic component comprising:
   a radiation source for supplying an optical radiation beam,
   a sensor comprising an electro-optic crystal,
   an optical system arranged in a path between the radiation source and the electro-optic crystal in order to focus the radiation beam in a radiation spot on a first side of the electro-optic crystal which is arranged to face the electronic component to be measured,
   an electrically conductive, tip-shaped element provided on the first side of the electro-optic crystal, and
   a detection system for deriving a detection signal from a change of phase in the radiation beam produced by the electro-optic crystal due to birefringence induced in the crystal by said electric signal.

19. The electro-optic measurement device as claimed in claim 18, wherein said optical system includes means for focusing the radiation beam in a radiation spot on the first side of the electro-optic crystal in an area where the tip-shaped element is located on said first side of the electro-optic crystal.

20. The electro-optic measurement device as claimed in claim 18, wherein said sensor further comprises a transparent carrier having an end face to which said electro-optic crystal is secured and with a transparent electrically conductive layer electrode sandwiched between said end face and a second opposed side of the electro-optic crystal.

21. The electro-optic measurement device as claimed in claim 18, wherein said sensor further comprises a transparent carrier to which said electro-optic crystal is secured, said transparent carrier being shaped as a sector of a sphere through which the radiant beam passes with reduced refraction and reflection at a spherical face of the transparent carrier.

* * * * *